United States Patent
Yoneda

(10) Patent No.: US 6,773,999 B2
(45) Date of Patent: Aug. 10, 2004

(54) METHOD FOR TREATING THICK AND THIN GATE INSULATING FILM WITH NITROGEN PLASMA

(75) Inventor: Kenji Yoneda, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/195,367

(22) Filed: Jul. 16, 2002

(65) Prior Publication Data

US 2003/0015763 A1 Jan. 23, 2003

(30) Foreign Application Priority Data

Jul. 18, 2001 (JP) ........................................ 2001-217571

(51) Int. Cl.[7] ........................................ H01L 21/4763
(52) U.S. Cl. .................. 438/287; 438/591; 438/769; 438/776; 438/777; 438/786; 438/792; 438/981
(58) Field of Search ................................ 438/287, 308, 438/585, 591, 981, 769, 775–777, 791–798

(56) References Cited

U.S. PATENT DOCUMENTS

| | | | |
|---|---|---|---|
| 5,834,351 A | * 11/1998 | Chang et al. | 438/266 |
| 6,040,249 A | * 3/2000 | Holloway | 438/769 |
| 6,087,236 A | * 7/2000 | Chau et al. | 438/301 |
| 6,432,786 B2 | * 8/2002 | Chen et al. | 438/305 |
| 6,436,771 B1 | * 8/2002 | Jang et al. | 438/275 |
| 6,459,126 B1 | * 10/2002 | Mogami et al. | 257/350 |
| 6,562,729 B2 | * 5/2003 | Kamath et al. | 438/769 |
| 2001/0052618 A1 | * 12/2001 | Hasegawa | 257/345 |
| 2002/0019142 A1 | * 2/2002 | Moore | 438/765 |
| 2002/0072177 A1 | * 6/2002 | Grider | 438/287 |
| 2002/0130377 A1 | * 9/2002 | Khare et al. | 257/410 |
| 2002/0185693 A1 | * 12/2002 | Yasuda et al. | 257/392 |

FOREIGN PATENT DOCUMENTS

TW 434735 3/1995

* cited by examiner

*Primary Examiner*—Thanh Nguyen
(74) *Attorney, Agent, or Firm*—Nixon Peabody LLP; Donald R. Studebaker

(57) ABSTRACT

A semiconductor device includes a gate insulating film formed on a semiconductor substrate, and a gate electrode formed on the gate insulating film. Nitrogen is introduced into the gate insulating film, and the nitrogen concentration distribution thereof has a peak near the surface of the gate insulating film or near the center of the gate insulating film in the thickness direction. The peak value of nitrogen concentration in the gate insulating film is equal to or greater than 10 atm % and less than or equal to 40 atm %.

20 Claims, 13 Drawing Sheets

— : WITH PLASMA NITRIDING PROCESS
--- : WITH THERMAL OXYNITRIDING PROCESS

— : WITH PLASMA NITRIDING PROCESS
--- : WITH THERMAL OXYNITRIDING PROCESS

METHOD FOR TREATING THICK AND THIN GATE INSULATING FILM WITH NITROGEN PLASMA

BACKGROUND OF THE INVENTION

The present invention relates to a semiconductor device and a method for manufacturing the same, and more particularly to a method for forming a gate insulating film used in a MIS transistor.

A MOS transistor is a typical MOS device. For example, in a complementary MOS (CMOS) transistor, or the like, a high speed driving transistor, which is required to have a gate insulating film of a relatively thin thickness, and a high breakdown-voltage transistor, which is required to have a gate insulating film of a relatively thick thickness for handling input/output signals of a relatively high voltage, are formed on a single semiconductor substrate.

The high speed driving transistor is required to have a gate insulating film having a thickness of about 1 nm to 3 nm, while it is strongly required to have a high reliability in resisting against dielectric breakdown and to have a low leakage current.

A CMOS transistor employs a so-called "dual gate structure", in which the gate electrode of the P-channel transistor is a P-type gate electrode obtained by using boron (B) as a dopant, and the gate electrode of the N-channel transistor is an N-type gate electrode obtained by using phosphorus (P) as a dopant. Boron, being a P-type dopant, has a larger diffusion coefficient than that of phosphorus, being an N-type dopant, whereby during a heat treatment after the transistor is formed, boron diffuses through the gate insulating film of the high speed driving transistor to reach the channel region. The diffusion of boron is called "boron penetration", and causes various problems in the transistor such as a substantial variation in the threshold voltage and a deterioration of the driving ability. The boron penetration is, of course, more pronounced as the thickness of the gate insulating film is reduced, and is particularly pronounced when silicon dioxide ($SiO_2$) is used for the gate insulating film.

Furthermore, reducing the thickness of the gate insulating film also causes an increase in the gate leakage current through the gate insulating film. Again, where silicon dioxide is used for the gate insulating film, the conduction mechanism thereof is a Fowler-Nordheim tunneling current if the thickness is 3.5 nm or more, and the direct tunneling current becomes dominant if the thickness is 3.5 nm or less. The gate leakage current increases by an order of magnitude for every 0.2 nm decrease in the thickness of the gate insulating film. If the thickness of the gate insulating film is set to be 2.6 nm or less, the gate leakage current is no longer negligible.

As described above, if a thermal oxide film is used for the gate insulating film, it is no longer possible to suppress the boron penetration and the gate leakage current. In view of this, an oxynitride film into which nitrogen is introduced has been used as a gate insulating film.

A conventional method for forming a gate insulating film of a MOS semiconductor device using a silicon oxynitride film will now be described with reference to the drawings.

FIG. 12A to FIG. 12C are cross-sectional views sequentially illustrating the steps of the conventional method for forming a gate insulating film.

First, a device isolation region 102 that partitions a plurality of device forming regions from one another is formed in an upper portion of a semiconductor substrate 101 made of silicon, and then a first gate oxide film 103A made of a thermal oxide film having a thickness of about 7.5 nm is formed entirely across the upper surface of the semiconductor substrate 101. Then, a resist pattern 104 having an opening in a second region 202 is formed on the first gate oxide film 103A, and then a portion of the first gate oxide film 103A that is included in the second region 202 is etched away using the resist pattern 104 so that the second region of the semiconductor substrate 101 is exposed, thereby obtaining a structure as illustrated in FIG. 12A.

Then, as illustrated in FIG. 12B, the semiconductor substrate 101 is subjected to a heat treatment so as to form a second gate oxide film 105A made of a thermal oxide film having a thickness of about 2.6 nm in the second region 202. In this process, the thickness of the first gate oxide film 103A increases.

Then, as illustrated in FIG. 12C, the semiconductor substrate 101 is subjected to a heat treatment in an oxynitriding atmosphere made of nitrogen monoxide (NO) at a temperature of 900° C. for 30 seconds to several ten minutes so as to introduce nitrogen into the first gate oxide film 103A and the second gate oxide film 105A, thereby obtaining a first gate oxynitride film 103B and a second gate oxynitride film 105B, respectively. Note that other than nitrogen monoxide (NO), dinitrogen monoxide ($N_2O$) or, though rarely, ammonia ($NH_3$) may be used in the oxynitriding process using a heat treatment.

When nitrogen monoxide (NO) is used, the oxynitriding process increases the thickness only by 0.3 nm or less. In contrast, when dinitrogen monoxide is used, it is required to perform an oxynitriding process under a high temperature of about 1000° C. to 1150° C. for several ten seconds to several ten minutes, whereby the oxynitriding process with dinitrogen monoxide ($N_2O$) increases the thickness by a substantial amount of up to several nanometers. Therefore, with dinitrogen monoxide ($N_2O$), care should be taken for the process.

FIG. 13A and FIG. 13B are each a nitrogen concentration profile in a gate oxynitride film which has been oxynitrided by using an oxynitriding atmosphere made of nitrogen monoxide (NO), wherein FIG. 13A is for the first gate oxynitride film 103B and FIG. 13B is for the second gate oxynitride film 105B. As illustrated in FIG. 13B, in the second gate oxynitride film 105B having a thickness of 2.6 nm, the nitrogen atom peak is located near the interface between the second gate oxynitride film 105B and the semiconductor substrate 101. The peak concentration is about 4 atm % at maximum, through it varies depending on the oxynitriding temperature. Note that also when the oxynitriding process is performed by using dinitrogen monoxide ($N_2O$), the nitrogen concentration profile is as that shown in FIG. 13B, and the peak concentration is, at best, 1 atm %.

The second gate oxynitride film 105B obtained by the conventional oxynitriding process has a nitrogen concentration profile and a nitrogen concentration peak as shown in FIG. 13B, whereby boron ion implanted into the p-type gate electrode of the P-channel transistor diffuses through the second gate oxynitride film 105B relatively easily, though it depends on the heat treatment temperature, and reaches the channel region in the semiconductor substrate 101. The diffusion of boron is of course suppressed as compared with a gate oxide film made only of silicon dioxide. However, when the thickness is reduced so much as in the second gate oxynitride film 105B, it is not possible substantially prevent the diffusion of boron with a nitrogen concentration profile in which the nitrogen peak concentration is only about 4 atm % and the peak is located near the interface with the semiconductor substrate 101. This is the first problem in the prior art.

Furthermore, with such a silicon oxynitride film, in which the nitrogen concentration is only about 4 atm % and the nitrogen atoms are localized near the substrate interface, the nitrogen content of the film as a whole is not sufficient to change the dielectric constant and the refractive index of silicon dioxide ($SiO_2$), and thus it is certainly not expected to be sufficient to provide an increase in the electric capacitance or a reduction in the gate leakage current. This is the second problem in the prior art.

SUMMARY OF THE INVENTION

An object of the present invention is to solve these problems in the prior art and to make it possible to reduce the gate leakage current while preventing dopant atoms from diffusing from a gate electrode into a substrate through a gate insulating film having a thickness that is so reduced that a direct tunneling current can flow therethrough.

The present inventor has conducted various researches to make it possible to suppress the penetration or diffusion of boron through a thinned gate insulating film while reducing the gate leakage current. As a result, it has been found that it is preferred that the nitrogen concentration in the gate insulating film is sufficiently high with a broad nitrogen distribution in the insulation film and that a low-temperature process is used for an improved control of the thickness of the thin film. Moreover, it has also been found that in order to obtain an increased nitrogen concentration in an oxynitriding process using nitrogen monoxide or dinitrogen monoxide, it is necessary to increase the heat treatment temperature of the oxynitriding process, which is not suitable for the formation of a very thin gate insulating film.

Therefore, in order to prevent the penetration of boron through a gate insulating film and to increase the dielectric constant and the refractive index by increasing the nitrogen concentration, thereby reducing the gate leakage current, it is necessary to form, as a thin gate insulating film, an oxynitride film that has a broad nitrogen distribution with a nitrogen peak concentration over 10 atm %.

Specifically, a semiconductor device of the present invention includes: a gate insulating film formed on a semiconductor substrate; and a gate electrode formed on the gate insulating film, wherein nitrogen is introduced into the gate insulating film and a nitrogen concentration distribution thereof has a first peak near a surface of the gate insulating film or near a center of the gate insulating film in a thickness direction.

With the semiconductor device of the present invention, nitrogen is introduced into the gate insulating film, and the nitrogen concentration distribution thereof has the first peak near the surface of the gate insulating film or near the center of the gate insulating film in the thickness direction. Therefore, despite the reduced thickness of the gate insulating film, it is possible to prevent the diffusion of dopant atoms from the gate electrode into the semiconductor substrate while reducing the gate leakage current. Furthermore, the dielectric constant of the gate insulating film increases, thereby increasing the resistance to dielectric breakdown.

In the semiconductor device of the present invention, it is preferred that the nitrogen concentration distribution of the gate insulating film has a second peak near an interface between the gate insulating film and the semiconductor substrate.

In this way, at the interface between the gate insulating film and the semiconductor substrate, the electrical stress resistance or immunity of the gate insulating film is improved, and the gate leakage current is reduced.

In the semiconductor device of the present invention, it is preferred that a value of the first peak of nitrogen concentration in the gate insulating film is equal to or greater than 10 atm % and less than or equal to 40 atm %.

Moreover, in the semiconductor device of the present invention, it is preferred that the nitrogen concentration in the gate insulating film at an interface between the gate insulating film and the semiconductor substrate is equal to or greater than 0.2 atm % and less than or equal to 3 atm %.

A first method for manufacturing a semiconductor device of the present invention includes the steps of: (a) forming a base gate insulating film on a semiconductor substrate; and (b) exposing the base gate insulating film to a nitrogen plasma so as to introduce nitrogen atoms into the base gate insulating film, thereby forming a gate insulating film from the base gate insulating film.

With the first method for manufacturing a semiconductor device, the gate insulating film is formed from a base gate insulating film by introducing nitrogen atoms into the base gate insulating film by exposing the base gate insulating film to a nitrogen plasma, whereby it is possible to form, as a thinned gate insulating film, an oxynitride film that has a relatively broad nitrogen distribution with a nitrogen peak concentration over 10 atm %. As a result, despite the reduced thickness of the gate insulating film, it is possible to prevent the diffusion of dopant atoms from the gate electrode into the semiconductor substrate while reducing the gate leakage current. Furthermore, the dielectric constant of the gate insulating film increases, thereby increasing the resistance to dielectric breakdown.

In the first method for manufacturing a semiconductor device, it is preferred that in the step (a), the semiconductor substrate is subjected to a heat treatment in an oxidizing atmosphere so as to form the base gate insulating film made of an oxide film on the semiconductor substrate.

Moreover, in the first method for manufacturing a semiconductor device, it is preferred that in the step (a), the semiconductor substrate is subjected to a heat treatment in an oxynitriding atmosphere without hydrogen so as to form the base gate insulating film made of an oxynitride film on the semiconductor substrate.

As described above, in the step (a), the base gate insulating film is formed by performing a heat treatment in an oxynitriding atmosphere without hydrogen, whereby nitrogen atoms are introduced also into a portion of the base gate insulating film near the interface between the base gate insulating film and the semiconductor substrate. As a result, the electrical stress resistance or immunity of the base gate insulating film is improved, and the gate leakage current is reduced.

In such a case, it is preferred that the oxynitriding atmosphere is an atmosphere containing nitrogen monoxide and oxygen or an atmosphere containing dinitrogen monoxide.

In such a case, it is preferred that the method further includes, before the step (a), a step of implanting impurity ion that causes an enhanced oxidization effect into the semiconductor substrate.

In this way, the thickness of the base gate insulating film grown on the semiconductor substrate is increased by the accelerated oxidization effect. Thus, by selectively implanting impurity ion that causes an accelerated oxidization effect, the thickness of the base gate insulating film in the region in which the impurity ion is implanted can be made different from that in the region in which the impurity ion is not implanted.

In the first method for manufacturing a semiconductor device, it is preferred that in the step (a), the semiconductor substrate is subjected to an oxynitriding atmosphere containing a nitrogen plasma and an oxygen plasma produced from dinitrogen monoxide so as to form the base gate insulating film made of an oxynitride film on the semiconductor substrate.

In the first method for manufacturing a semiconductor device, it is preferred that the method further includes, before the step (a): a first step of partitioning the semiconductor substrate into a first region and a second region; a second step of forming a first base gate insulating film made of a thermal oxide film on the first region and the second region; and a third step of removing a portion of the first base gate insulating film that is included in the second region, wherein: in the step (a), a second base gate insulating film to be the gate insulating film having a thickness smaller than that of the first base gate insulating film is formed on the second region of the semiconductor substrate; and in the step (b), the first base gate insulating film and the second base gate insulating film are exposed to a nitrogen plasma so as to introduce nitrogen atoms into the first base gate insulating film and the second base gate insulating film, thereby forming a first gate insulating film from the first base gate insulating film and a second gate insulating film to be the gate insulating film from the second base gate insulating film.

In this way, the first gate insulating film and the second gate insulating film, which have different thicknesses, can be formed on the first region and the second region, respectively, of the semiconductor substrate, while nitrogen atoms can be reliably introduced into each gate insulating film.

In such a case, it is preferred that: a thickness of the first gate insulating film is equal to or greater than 3.5 nm and less than or equal to 9 nm, and a nitrogen concentration distribution thereof has a peak near a surface of the first gate insulating film and another peak near an interface between the first gate insulating film and the semiconductor substrate; and a thickness of the second gate insulating film is equal to or greater than 1.0 nm and less than or equal to 3.0 nm, and a nitrogen concentration distribution thereof has a peak near a center of the second gate insulating film in a thickness direction.

In the first method for manufacturing a semiconductor device, it is preferred that the method further includes, before the step (a): a first step of partitioning the semiconductor substrate into a first region, a second region and a third region; a second step of forming a first base gate insulating film made of a thermal oxide film on the first region, the second region and the third region; a third step of implanting impurity ion that causes an enhanced oxidization effect into the second region of the semiconductor substrate, after the second step; and a fourth step of removing a portion of the first base gate insulating film that is included in the second region and the third region, wherein: in the step (a), a second base gate insulating film having a thickness smaller than that of the first base gate insulating film is formed on the second region of the semiconductor substrate, and a third base gate insulating film to be the gate insulating film having a thickness smaller than that of the second base gate insulating film is formed on the third region; and in the step (b), the first base gate insulating film, the second base gate insulating film and the third base gate insulating film are exposed to a nitrogen plasma so as to introduce nitrogen atoms into the first base gate insulating film, the second base gate insulating film and the third base gate insulating film, thereby forming a first gate insulating film from the first base gate insulating film, a second gate insulating film from the second base gate insulating film and a third gate insulating film to be the gate insulating film from the third base gate insulating film.

In this way, the first gate insulating film, the second gate insulating film and the third gate insulating film, which have different thicknesses, can be formed on the first region, the second region and the third region, respectively, of the semiconductor substrate, while nitrogen atoms can be reliably introduced into each gate insulating film.

In the first method for manufacturing a semiconductor device, it is preferred that the impurity ion is fluorine or silicon, which is implanted into a portion of the semiconductor substrate near a surface thereof at a dose equal to or greater than $1 \times 10^{14}$ cm$^{-2}$ and less than or equal to $5 \times 10^{15}$ cm$^{-2}$.

In the first method for manufacturing a semiconductor device, it is preferred that the nitrogen plasma is a high-density plasma at a temperature in a range from room temperature to 500° C.

In the first method for manufacturing a semiconductor device, it is preferred that a peak value of nitrogen concentration in the gate insulating film is equal to or greater than 10 atm % and less than or equal to 40 atm %.

In the first method for manufacturing a semiconductor device, it is preferred that an oxygen plasma is added to the nitrogen plasma.

A second method for manufacturing a semiconductor device of the present invention includes the steps of: (a) exposing an entire surface of a semiconductor substrate to a nitrogen plasma and an oxygen plasma so as to form a gate insulating film made of an oxynitride film on the semiconductor substrate; and (b) selectively forming a gate electrode on the gate insulating film.

With the second method for manufacturing a semiconductor device, it is possible to form, as a gate insulating film formed on the semiconductor substrate, an oxynitride film that has a relatively broad nitrogen distribution with a nitrogen peak concentration over 10 atm % by exposing the entire surface of the semiconductor substrate to a nitrogen plasma and an oxygen plasma. As a result, despite the reduced thickness of the gate insulating film, it is possible to prevent the diffusion of dopant atoms from the gate electrode into the semiconductor substrate while reducing the gate leakage current. Furthermore, the dielectric constant of the gate insulating film increases, thereby increasing the resistance to dielectric breakdown.

In the second method for manufacturing a semiconductor device, it is preferred that the method further includes, before the step (a): a first step of partitioning the semiconductor substrate into a first region and a second region; a second step of forming a first base gate insulating film made of a thermal oxide film on the first region and the second region; and a third step of removing a portion of the first base gate insulating film that is included in the second region, wherein in the step (a), the entire surface of the semiconductor substrate including the first base gate insulating film is exposed to the nitrogen plasma and the oxygen plasma so as to form a second gate insulating film to be the gate insulating film having a thickness smaller than that of the first base gate insulating film on the second region and to introduce nitrogen atoms into the first base gate insulating film, thereby forming a first gate insulating film from the first base gate insulating film.

In this way, the first gate insulating film and the second gate insulating film, which have different thicknesses and into which nitrogen atoms are introduced, can be formed on the first region and the second region, respectively, of the semiconductor substrate.

In such a case, it is preferred that: a thickness of the first gate insulating film is equal to or greater than 3.5 nm and less than or equal to 9 nm, and a nitrogen concentration distribution thereof has a peak near a surface of the first gate insulating film; and a thickness of the second gate insulating film is equal to or greater than 1.0 nm and less than or equal to 3.0 nm, and a nitrogen concentration distribution thereof has a peak near a center of the second gate insulating film in a thickness direction.

BRIEF DESCRIPTION OF THE DRAWINGS

FIG. 3A and FIG. 3B are each a nitrogen concentration profile in a gate insulating film immediately after the formation of a second gate insulating film illustrated in FIG. 2A, wherein FIG. 3A is for a first gate insulating film and FIG. 3B is for the second gate insulating film.

FIG. 4A and FIG. 4B are each a nitrogen concentration profile in a gate insulating film after a plasma nitridation process illustrated in FIG. 2B, wherein FIG. 4A is for the first gate insulating film and FIG. 4B is for the second gate insulating film.

FIG. 9A and FIG. 9B are each a nitrogen concentration profile in a gate insulating film after a plasma nitridation process illustrated in FIG. 8C, wherein FIG. 9A is for the first gate insulating film and FIG. 9B is for the second gate insulating film.

FIG. 13A and FIG. 13B are each a nitrogen concentration profile in a gate insulating film after the oxynitriding process illustrated in FIG. 12C, wherein FIG. 13A is for the first gate insulating film and FIG. 13B is for the second gate insulating film.

DETAILED DESCRIPTION OF THE INVENTION

First Embodiment

The first embodiment of the present invention will now be described with reference to the drawings.

FIG. 1A to FIG. 1C and FIG. 2A to FIG. 2C are cross-sectional views sequentially illustrating the steps of a method for manufacturing a semiconductor device according to the first embodiment of the present invention.

Figure 1A:
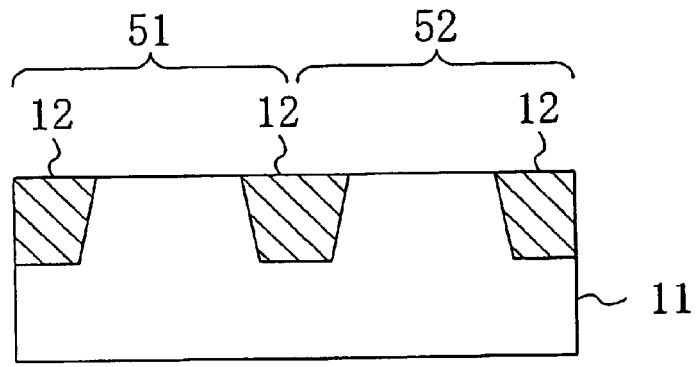
FIG. 1A to FIG. 1C are cross-sectional views sequentially illustrating steps of a method for manufacturing a semiconductor device according to the first embodiment of the present invention.

First, as illustrated in FIG. 1A, a semiconductor substrate 11 is prepared. For example, the semiconductor substrate 11 includes, in an upper portion thereof, an epitaxial layer (not shown) having a thickness of about 5 $\mu$m and made of P-type silicon whose specific resistance is about 11 $\Omega$cm to 14 $\Omega$cm, and the semiconductor substrate 11 has a specific resistance of about 0.01 $\Omega$cm to 0.02 $\Omega$cm. Then, a device isolation region 12, which is a shallow trench isolation, is formed in an upper portion of the semiconductor substrate 11. The device isolation region 12 partitions the principal surface of the semiconductor substrate 11 at least into a first device forming region 51 and a second device forming region 52. Then, although not shown, a P-type well region and an N-type well region are formed in the semiconductor substrate 11, and a channel doping process is performed for adjusting the threshold voltage of the transistor.

Figure 1B:
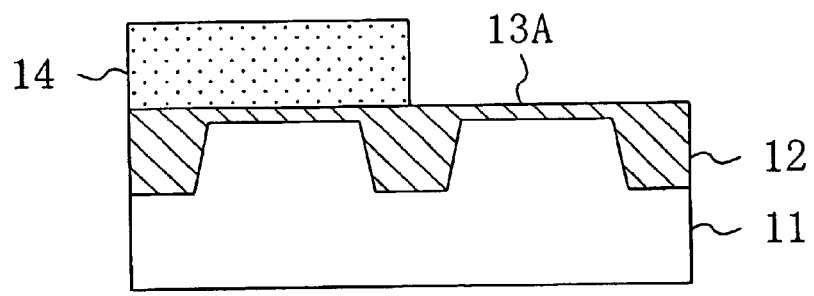

Then, the surface of the semiconductor substrate 11, in which the device isolation region 12 has been formed, is subjected to an SC1 cleaning process with a mixed solution of ammonium hydroxide ($NH_4OH$), hydrogen peroxide ($H_2O_2$) and water ($H_2O$) at a temperature of about 50° C., and a cleaning process with diluted hydrofluoric acid solution (HF), so as to remove the natural oxide film from the semiconductor substrate 11. Then, the cleaned semiconductor substrate 11 is placed into a vertical electric furnace, and the semiconductor substrate 11 is subjected to pyrogenic oxidization at a temperature of about 800° C., thereby forming a first gate insulating film 13A made of silicon dioxide having a thickness of about 5.5 nm on the principal surface of the semiconductor substrate 11. Then, a resist pattern 14 having an opening in the second device forming region 52 is formed on the semiconductor substrate 11 by using a photolithography method, thereby obtaining a structure as illustrated in FIG. 1B.

Figure 1C:
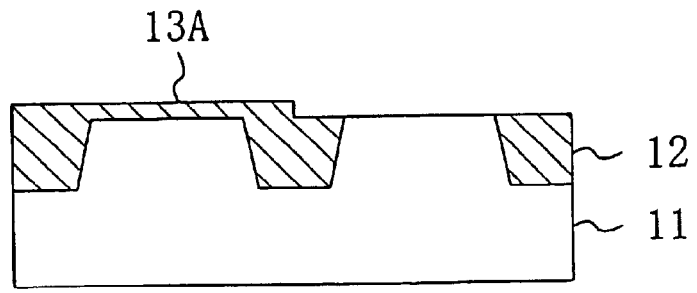

Then, as illustrated in FIG. 1C, a portion of the first gate insulating film 13A that is included in the second device forming region 52 is removed by using the resist pattern 14 as a mask and using a buffered hydrofluoric acid solution.

Then, a piranha cleaning (=SPM cleaning) process with a mixed solution of sulfuric acid ($H_2SO_4$) and hydrogen peroxide is performed to remove the resist pattern 14. Then, the second device forming region 52 of the semiconductor substrate 11 is subjected to an SC1 cleaning process at a temperature of 50° C., as a pre-cleaning process for the formation of a second gate insulating film. As a result of the SC1 cleaning process, the thickness of the first gate insulating film 13A is reduced by about 0.2 nm to be about 5.3 nm.

Figure 2A:
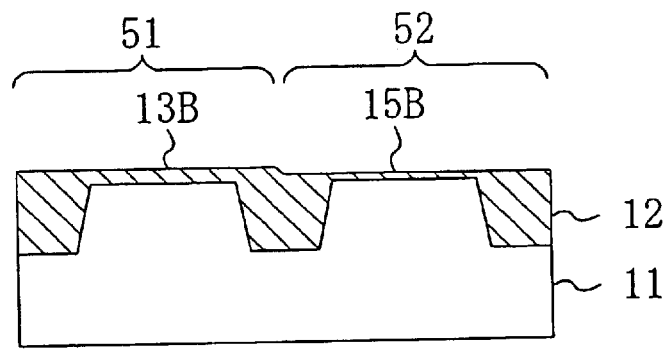
FIG. 2A to FIG. 2C are cross-sectional views sequentially illustrating steps of the method for manufacturing a semiconductor device according to the first embodiment of the present invention.

Then, as illustrated in FIG. 2A, the semiconductor substrate 11 as illustrated in FIG. 1C is placed into a rapid thermal processor (RTP), and is subjected to an oxynitriding process in an oxynitriding atmosphere made of a dinitrogen monoxide ($N_2O$) gas at a atmospheric pressure or reduced pressure and at a temperature of about 900° C., so as to form a second gate insulating film 15B made of silicon oxynitride having a thickness of about 1.8 nm in the second device forming region 52 of the semiconductor substrate 11. In this process, nitrogen atoms are introduced by the oxynitriding process also into the first gate insulating film 13A and the thickness thereof increases to be about 5.5 nm. Thus, the first gate insulating film 13A is altered into a first gate insulating film 13B made of a silicon oxynitride film. Note that a mixed gas of about 10% by volume of nitrogen monoxide (NO) and about 90% by volume of oxygen ($O_2$) may be used, instead of dinitrogen monoxide, as the oxynitriding atmosphere.

Figure 2B:
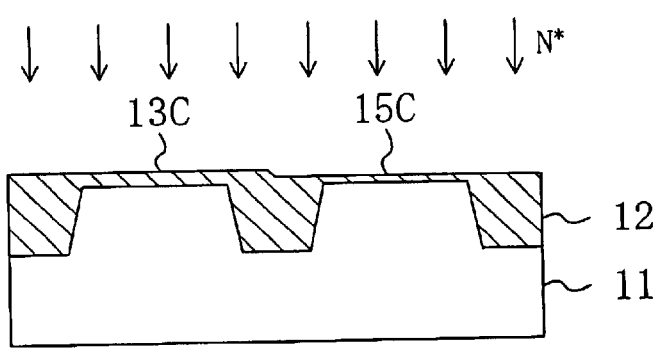

Then, as illustrated in FIG. 2B, a nitridation process is performed in which the first gate insulating film 13B and the second gate insulating film 15B are exposed to a nitrogen ($N_2$) plasma. In FIG. 2B, the designation "N*" is used for nitrogen radicals. A high density plasma of nitrogen plasma is produced by using, for example, an inductively-coupled plasma system or a helicon plasma system. In a case where an inductively-coupled plasma system is used, the substrate is exposed to a nitrogen plasma for about 90 seconds with a plasma-producing frequency of about 13.56 MHz, a high-frequency power of about 500 W, a chamber pressure of about 1.33 Pa and a substrate temperature of about 30° C. Herein, no substrate bias is applied. In a case where a helicon plasma system is used, the substrate is exposed to a nitrogen plasma for about 120 seconds with a plasma-producing frequency of about 13.56 MHz, a high-frequency power of about 500 W, a chamber pressure of about 1.33 Pa and a substrate temperature of about 30° C. By performing either nitridation process, the first gate insulating film 13B and the second gate insulating film 15B are further nitrided and altered into a first gate insulating film 13C and a second gate insulating film 15C, respectively.

Then, a conductive film having a thickness of about 150 nm and made of polycrystal silicon having a small and randomly oriented grain structure with a grain diameter of about 20 nm is deposited by using a CVD method, for example, at a deposition temperature of 680° C. on the first gate insulating film 13C and the second gate insulating film 15C, which have been subjected to the nitridation process with a nitrogen plasma. Then, the deposited conductive film is subjected to a predetermined patterning process so as to form gate electrodes 16 from the conductive film, thereby obtaining a structure as illustrated in FIG. 2C.

Then, although not shown, a predetermined ion implantation process is performed for each of the first device forming region 51 and the second device forming region 52 so as to form an LDD region and a source/drain region, thereby obtaining a transistor structure. In this process, the first gate insulating film 13C and the second gate insulating film 15C are simultaneously formed with thicknesses of about 5.5 nm and about 1.8 nm, respectively.

Note that the oxynitriding process in the step of forming the second gate insulating film 15B illustrated in FIG. 2A may be performed in an oxynitriding atmosphere containing a nitrogen plasma and an oxygen plasma produced from dinitrogen monoxide, instead of using RTP. In this way, the oxynitriding process can be performed at a low temperature even with dinitrogen monoxide, whereby it is possible to prevent an unnecessary increase in the thickness of the first gate insulating film 13B.

Figure 2C:
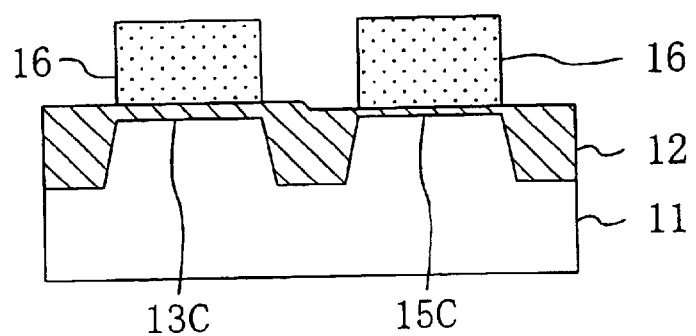

Moreover, before the deposition of the conductive film for forming gate electrodes illustrated in FIG. 2C, an annealing process may be performed in a normal-pressure or depressurized non-reactive atmosphere or small amount of oxygen and non-reactive atmosphere at a temperature of about 700° C. to about 1000° C. for several ten seconds, in order to stabilize nitrogen atoms in the first gate insulating film 13C and the second gate insulating film 15C. Note however that the nitrogen-stabilizing annealing process is not performed in the present embodiment.

The nitrogen concentration profiles of the first gate insulating films 13B and 13C, and the second gate insulating films 15B and 15C, will now be described.

Figure 3A:
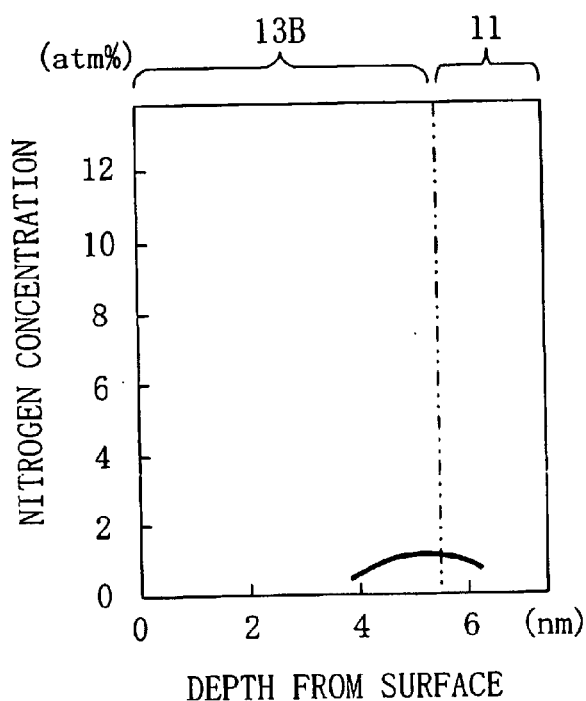
Figure 3B:
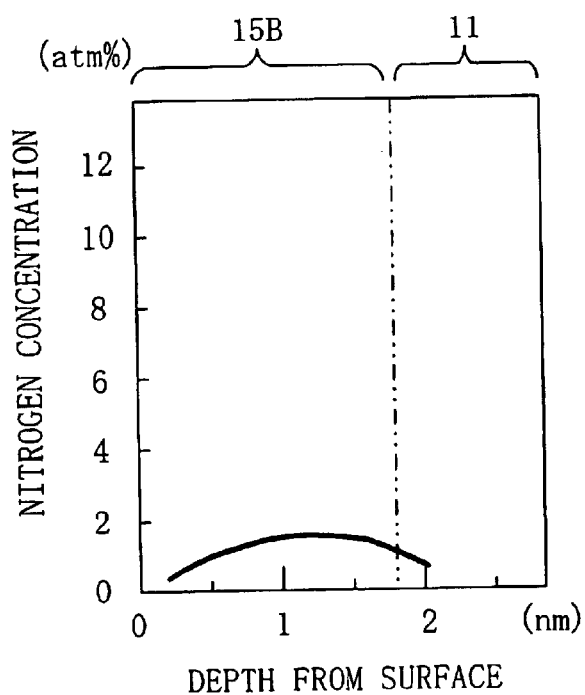

FIG. 3A and FIG. 3B are nitrogen concentration profiles in the first gate insulating film 13B and the second gate insulating film 15B as illustrated in FIG. 2A, wherein FIG. 3A is for the first gate insulating film 13B and FIG. 3B is for the second gate insulating film 15B.

As illustrated in FIG. 3A, the nitrogen concentration in the first gate insulating film 13B having a thickness of about 5.5 nm has a distribution with a peak value of about 1.0 atm % near the interface with the semiconductor substrate 11. On the other hand, as illustrated in FIG. 3B, the nitrogen concentration in the second gate insulating film 15B having a thickness of about 1.8 nm has a broad distribution in the insulation film with the concentration peak thereof being located near the center of the insulation film in the thickness direction (the direction vertical to the substrate plane). The peak nitrogen concentration is evaluated to be about 1.5 atm % by secondary ion mass spectrometry (SIMS).

Next, the nitrogen concentration profile after the nitridation process with an inductively-coupled plasma will be described.

Figure 4A:
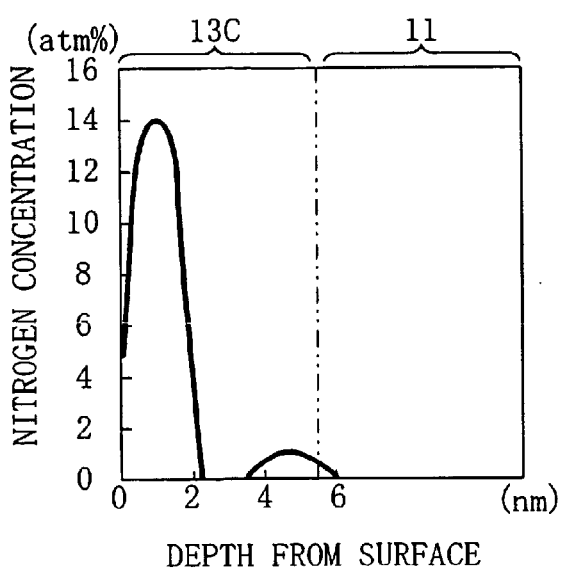
Figure 4C:
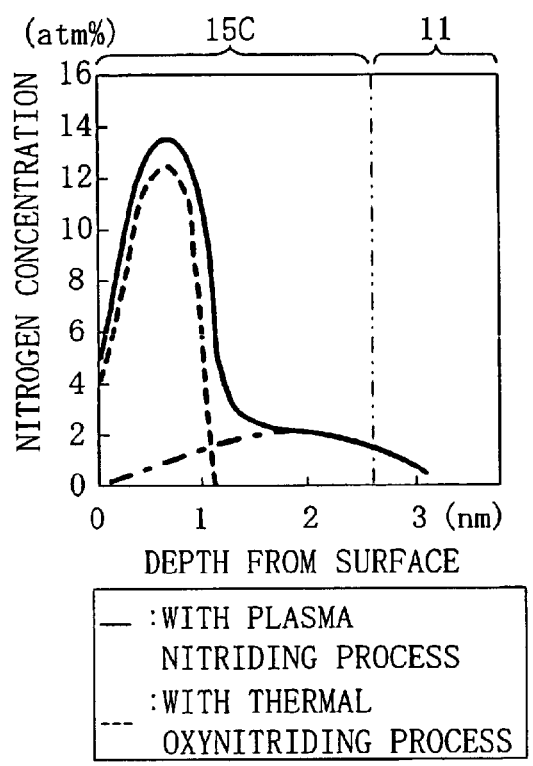
FIG. 4C, being presented for the purpose of comparison, is a nitrogen concentration profile that is obtained when the thickness of the second gate insulating film is increased.
Figure 4B:
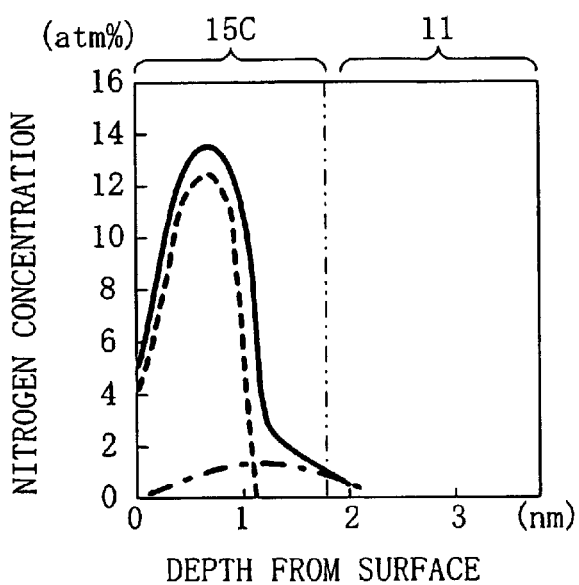

FIG. 4A and FIG. 4B are nitrogen concentration profiles in the first gate insulating film 13C and the second gate insulating film 15C as illustrated in FIG. 2B, wherein FIG. 4A is for the first gate insulating film 13C and FIG. 4B is for the second gate insulating film 15C.

As illustrated in FIG. 4A, the nitrogen distribution in the first gate insulating film 13C having a relatively large thickness includes a first peak near the surface thereof at which the nitrogen concentration is about 14 atm %, and a second peak near the interface with the semiconductor substrate 11 at which the nitrogen concentration is about 1 atm %.

On the other hand, as illustrated in FIG. 4B, the nitrogen distribution in the second gate insulating film 15C having a relatively thin thickness (indicated by a solid line) is the integrated value of the concentration profile obtained by a plasma nitridation process (indicated by a broken line) and the concentration profile obtained by a thermal oxynitriding process (indicated by a one-dot chain line). Herein, the thickness of the second gate insulating film 15C is about 1.8 nm, i.e., about ⅓ of that of the first gate insulating film 13C, whereby the second gate insulating film 15C has a relatively broad nitrogen distribution in the film. Moreover, the concentration distribution has a peak concentration of about 14 atm % near the center of the film in the thickness direction.

FIG. 4C, being presented for the purpose of comparison, is a nitrogen concentration profile that is obtained when the thickness of the second gate insulating film 15C is set to be about 2.6 nm. It can be seen that the nitrogen distribution does not substantially change even if the thickness of the second gate insulating film 15C is slightly increased to be about 2.6 nm. This is because the plasma-producing frequency and the high-frequency power are the factors that influence the nitrogen distribution.

Herein, as illustrated in FIG. 4A and FIG. 4B, the nitrogen concentration at the interface between the first gate insulating film 13C and the semiconductor substrate 11 and that between the second gate insulating film 15C and the semiconductor substrate 11 are both shown to be about 0.5 atm %. Thus, the nitrogen concentration at the interface between the gate insulating film 13C or 15C and the semiconductor substrate 11 is preferably about 0.2 atm % to about 3 atm %, and more preferably about 0.5 atm % to about 1 atm %. Then, the interface between the gate insulating film 13C and the semiconductor substrate 11 and the interface between the gate insulating film 15C and the semiconductor substrate 11 have desirable characteristics, whereby the electrical stress resistance or immunity of the gate insulating films 13C and 15C is improved, and the gate leakage current through the gate insulating films 13C and 15C can be reduced. Note that it is undesirable that the nitrogen concentration at the interface between the gate insulating film 13C or 15C and the semiconductor substrate 11 exceeds 3 atm %, in which case the threshold voltage of the MOS transistor may become unstable, and the carrier mobility may deteriorate.

The electric characteristics of a P-channel transistor using the second gate insulating film 15C of the first embodiment will now be described.

Figure 5:
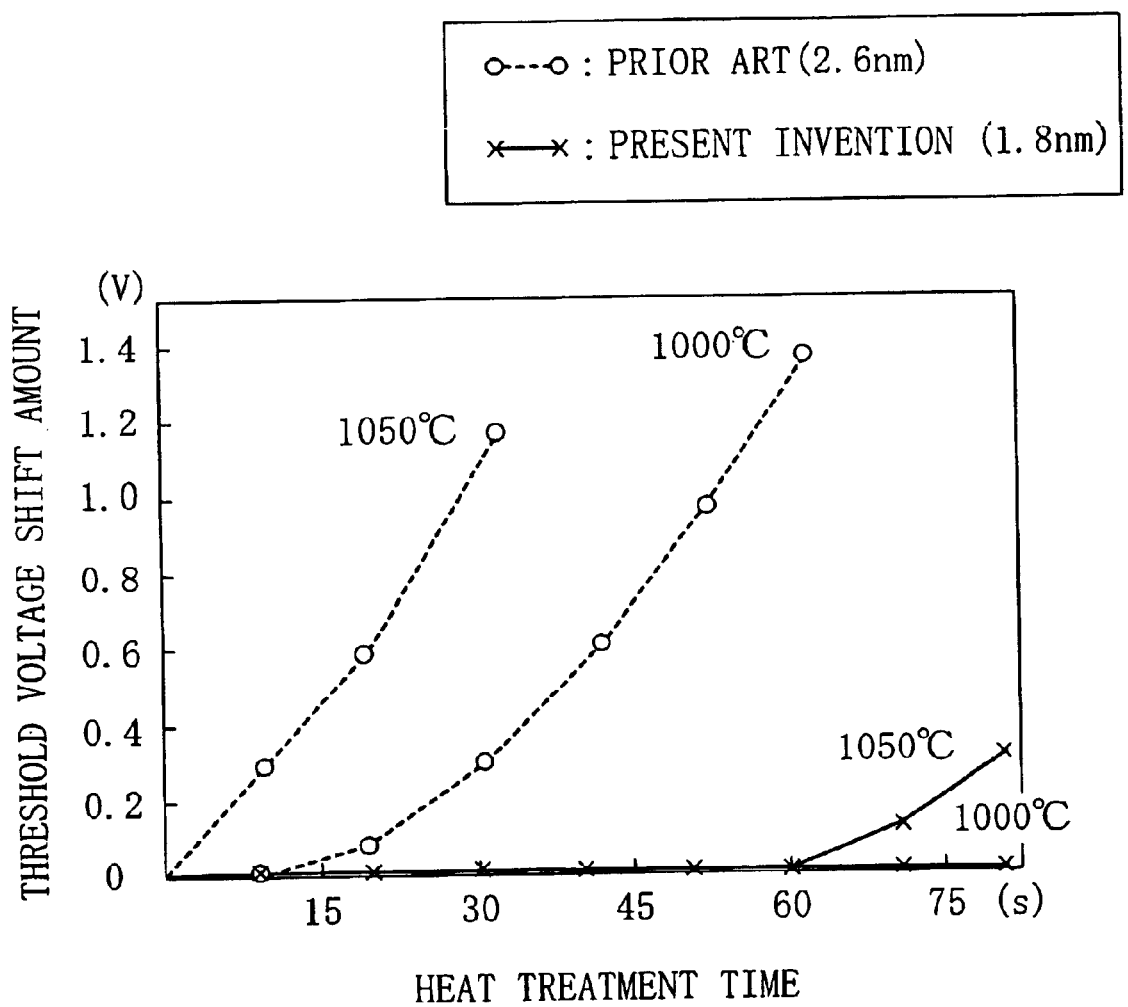
FIG. 5 is a graph showing the heat treatment time dependence of the change in threshold voltage due to penetration of boron from a P-type gate electrode in the method for manufacturing a semiconductor device according to the first embodiment of the present invention, in comparison with that of a conventional example.

FIG. 5 shows the heat treatment time dependence of the change in threshold voltage due to penetration of boron from a boron-doped P-type gate electrode of a P-channel transistor. As indicated by a solid line in FIG. 5, with the second gate insulating film 15C having a thickness of about 1.8 nm, there is no change in threshold voltage for heat treatment times of up to 60 seconds when the heat treatment temperature is about 1050° C., and there is no change in threshold voltage even if the heat treatment time exceeds 75 seconds when the heat treatment temperature is set to be about 1000° C. For comparison, broken lines show the heat treatment time dependence of the change in threshold voltage with a gate insulating film of a conventional example having a thickness of 2.6 nm, where the threshold voltage changes by 0.3 V only with a heat treatment for 30 seconds even when the heat treatment temperature is about 1000° C.

Figure 6:
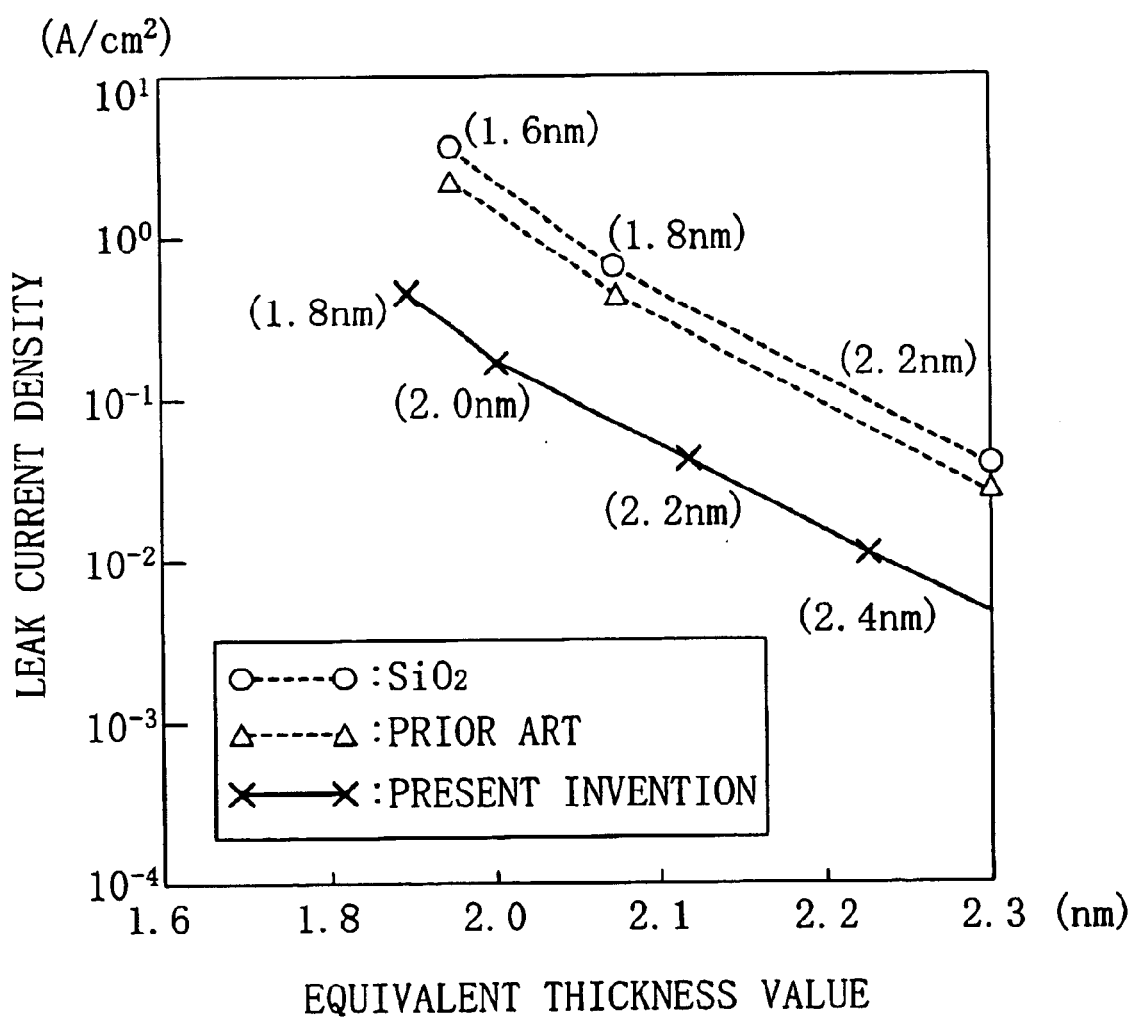
FIG. 6 is a graph showing the relationship between the gate leakage current and the $SiO_2$-equivalent thickness value in the method for manufacturing a semiconductor device according to the first embodiment of the present invention, in comparison with that of a conventional example.

FIG. 6 shows the relationship between the gate leakage current and the $SiO_2$-equivalent thickness value. Herein, the symbol "○" is used for a gate insulating film made of silicon dioxide, the symbol "Δ" is used for a gate insulating film of a conventional example, and the symbol "X" is used for the second gate insulating film formed by the method of the first embodiment. For each equivalent thickness value, a thickness value obtained by ellipsometry is provided in parentheses.

As shown in FIG. 6, based on the relationship between the gate leakage current and the equivalent thickness value of a silicon oxynitride film, which is obtained by changing the thickness of the second gate insulating film of the first embodiment, it can be seen that with the gate insulating film of the present embodiment, the gate leakage current can be reduced by about an order of magnitude if the equivalent thickness value is substantially equal to that of the conventional example.

Note that in the first embodiment, the first gate oxide film 13A is formed as a thermal oxide film, while the second gate insulating film 15B is formed as a thermal oxynitride film by using a dinitrogen monoxide atmosphere or a mixed atmosphere of nitrogen monoxide and oxygen. However, it is of course possible to obtain similar effects even if the second gate insulating film 15B is also formed by a thermal oxide film.

Note however that if the second gate insulating film 15B is formed by a thermal oxide film, the nitrogen concentration of the insulation film cannot be increased to a concentration as high as that of the second gate insulating film 15C of the first embodiment. Note that "nitrogen concentration" as used herein is not the peak value, but the integrated value of the nitrogen concentration in the insulation film. This is because the peak concentration is determined by the plasma oxynitriding process. The integrated value of the nitrogen concentration in the insulation film has a significant influence on the reduction of the penetration of boron and the reduction of the gate leakage current.

Next, the relationship between the nitrogen plasma exposure temperature and the nitrogen concentration of the insulation film will be described.

Figure 7:
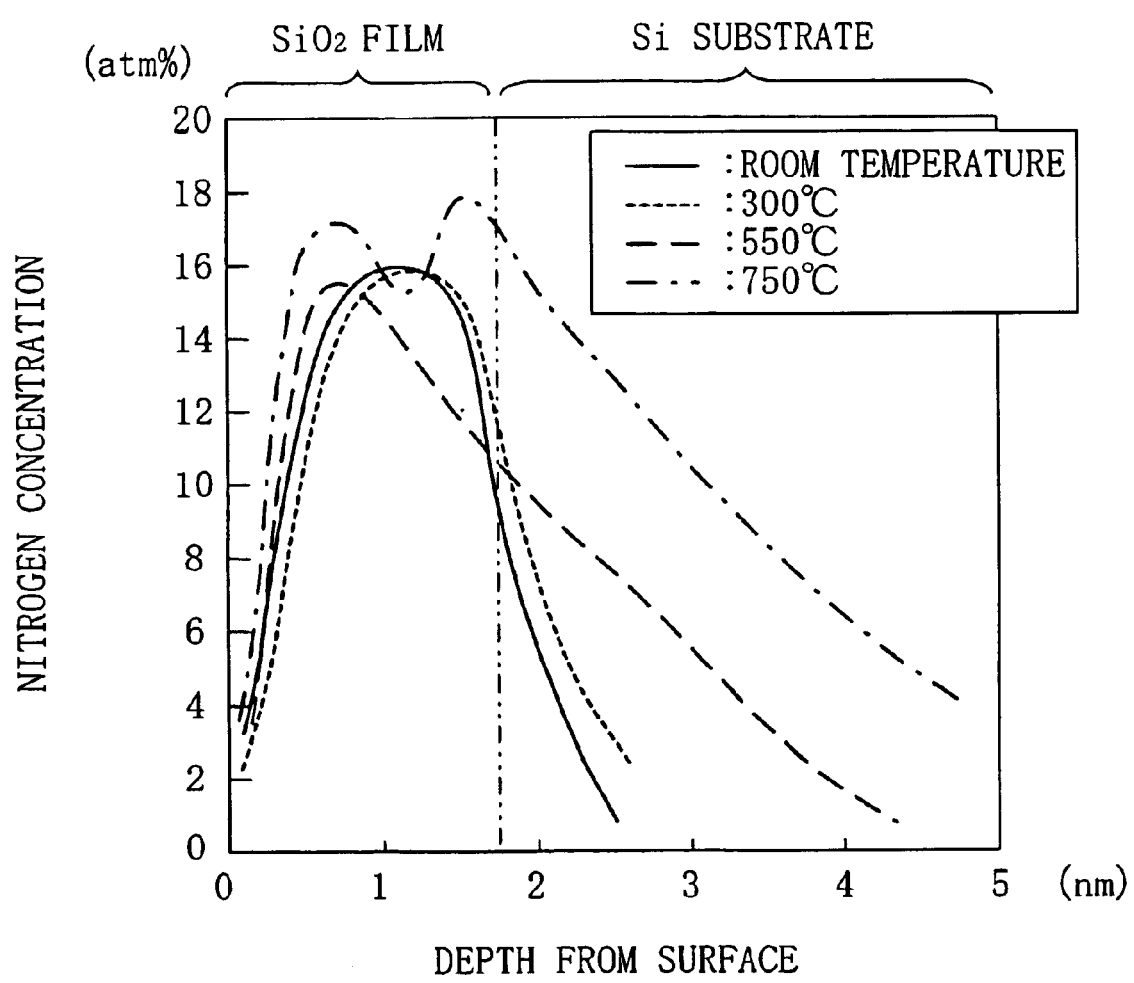
FIG. 7 is a graph showing the relationship between the nitrogen plasma exposure temperature and the nitrogen concentration of the insulation film in the method for manufacturing a semiconductor device according to the first embodiment of the present invention.

FIG. 7 shows the nitrogen distribution in the insulation film made of silicon dioxide and the substrate made of silicon for different nitrogen plasma exposure temperatures of room temperature, 300° C., 550° C. and 750° C. Note that "room temperature" as used herein refers to a temperature of about 20° C. to about 40° C. As can be seen from FIG. 7, exposure at a temperature around room temperature is preferred in order to obtain a high nitrogen concentration and a very sharp concentration distribution in the insulation film. With substrate temperatures of up to about 500° C., the influence on the nitrogen concentration and the nitrogen distribution is substantially negligible. Thus, the process temperature can be set in the range from room temperature to about 500° C.

Furthermore, as can be seen from FIG. 7, if the substrate is exposed to a nitrogen plasma at a temperature of 550° C. or more, the substrate is significantly nitrided, while the thickness distribution in the plane of the insulation film and the nitrogen concentration distribution in the insulation film deteriorate significantly, although not shown in the figure. Furthermore, when the temperature is increased to be 600° C. or more, it is difficult to realize a uniform and shallow nitrogen distribution in the insulation film due to the decomposition and thermal diffusion of nitrogen radicals on the insulation film surface. Therefore, the nitrogen plasma exposure is preferably done at a temperature that is around room temperature or, at maximum, less than or equal to about 500° C.

Note that the exposure may be done at a temperature lower than room temperature. However, it is recommended that the exposure is done at a temperature around room temperature because under such a low temperature, condensation, etc., may occur on the surface of the substrate. Furthermore, it is appropriate that the plasma exposure temperature is set to room temperature or a temperature slightly higher than room temperature in view of the convenience and stability of the process and the practicability of the apparatus. As described above, in the first embodiment, the nitridation process using a plasma performed at a temperature around room temperature is one important factor.

In order to introduce a high concentration of nitrogen into the insulation film (silicon dioxide film) by a process performed at a temperature in the range from room temperature to about 500° C., which is relatively low as a process temperature, the nitrogen radical concentration needs to be high. Therefore, in the present embodiment, a high-density plasma is used as a plasma source so that a high nitrogen radical concentration can be easily obtained. Moreover, since hydrogen atoms deteriorate the gate insulating film characteristics, it is preferred that a nitridation source gas containing no hydrogen is used for generating nitrogen radicals.

Moreover, with a common low-density plasma using microwave, or the like, a sufficient nitrogen radical supply cannot be obtained, and it is thus very difficult to introduce nitrogen into the insulation film at a high concentration.

Furthermore, the gate insulating film of the first embodiment requires a plasma that does not cause a charge-up phenomenon, i.e., a uniform plasma, in order to prevent dielectric breakdown due to the charge-up phenomenon. According to the present embodiment, the thickness distribution in the plane of a wafer having a diameter of about 200 mm is as small as ±0.1 nm (3σ, where "σ" represents the standard deviation) in a case where the thickness of the insulation film is 1.8 nm. A uniform thickness distribution and a nitrogen concentration profile as described above are necessary in view of the fact that the gate leakage current changes by as much as an order of magnitude for a 0.2 nm change in the thickness.

As described above, according to the first embodiment, despite the reduced thickness of the second gate insulating film 15C, it is possible to prevent the diffusion of dopant atoms from the gate electrode 16 into the semiconductor substrate 11 while reducing the gate leakage current. Furthermore, the dielectric constant of the second gate insulating film 15C increases, thereby increasing the resistance to dielectric breakdown.

Note that in the first embodiment, the formation of the second gate insulating film 15B and the nitridation process by plasma exposure may be performed by using separate apparatuses, or may be performed continuously by using a multi-chamber apparatus, i.e., by forming the second gate insulating film 15B in one chamber and then performing the nitridation process in another chamber.

Second Embodiment

The second embodiment of the present invention will now be described with reference to the drawings.

FIG. 8A to FIG. 8D are cross-sectional views sequentially illustrating the steps of a method for manufacturing a semiconductor device according to the second embodiment of the present invention.

Figure 8A:
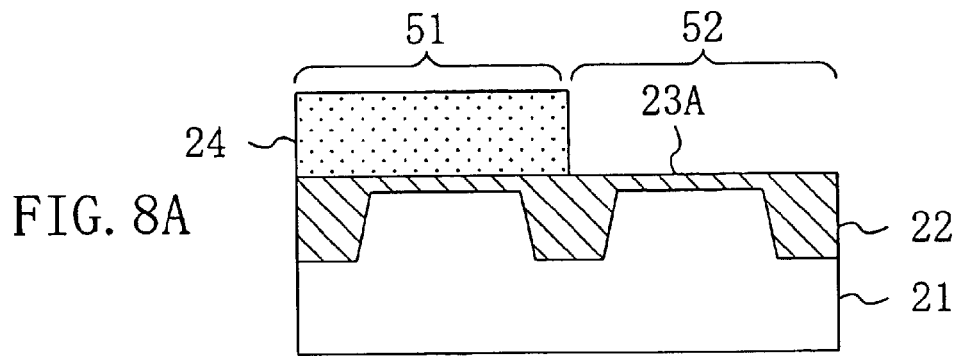
FIG. 8A to FIG. 8D are cross-sectional views sequentially illustrating the steps of a method for manufacturing a semiconductor device according to the second embodiment of the present invention.

First, a device isolation region 22, which is a shallow trench isolation, is formed in an upper portion of a semiconductor substrate 21 made of P-type silicon. The device isolation region 22 partitions at least the first device forming region 51 and the second device forming region 52 from each other. Then, although not shown, a P-type well region and an N-type well region are formed in an upper portion of the semiconductor substrate 21, and a channel doping process is performed for adjusting the threshold voltage of the transistor. Then, the surface of the semiconductor substrate 21, in which the device isolation region 22 has been formed, is subjected to an SC1 cleaning process at a temperature of about 50° C. and a cleaning process with diluted hydrofluoric acid solution (HF), so as to remove the natural oxide film from the semiconductor substrate 21. Then, the semiconductor substrate 21 is placed into an RTP, and the semiconductor substrate 21 is subjected to pyrogenic oxidization in a water vapor atmosphere at a temperature of about 1000° C., thereby forming a first gate insulating film 23A made of silicon dioxide having a thickness of about 7.5 nm on the principal surface of the semiconductor substrate 21. Then, a resist pattern 24 having an opening in the second device forming region 52 is formed on the semiconductor substrate 21 by using a photolithography method, thereby obtaining a structure as illustrated in FIG. 8A.

Figure 8B:
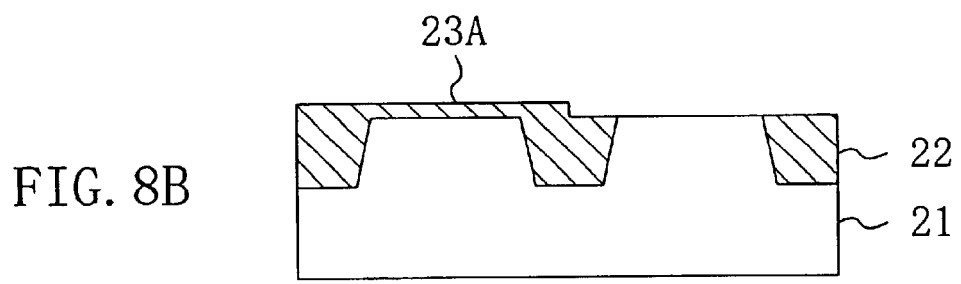

Then, as illustrated in FIG. 8B, a portion of the first gate insulating film 23A that is included in the second device forming region 52 is removed by using the resist pattern 24 as a mask and using a buffered hydrofluoric acid solution, and a piranha cleaning process is performed to remove the resist pattern 24. Then, the second device forming region 52 of the semiconductor substrate 21 is subjected to an SC1 cleaning process at a temperature of 50° C., as a pre-cleaning process for the formation of a second gate insulating film. As a result of the SC1 cleaning process, the thickness of the first gate insulating film 23A is reduced by about 0.2 nm to be about 7.3 nm.

Figure 8C:
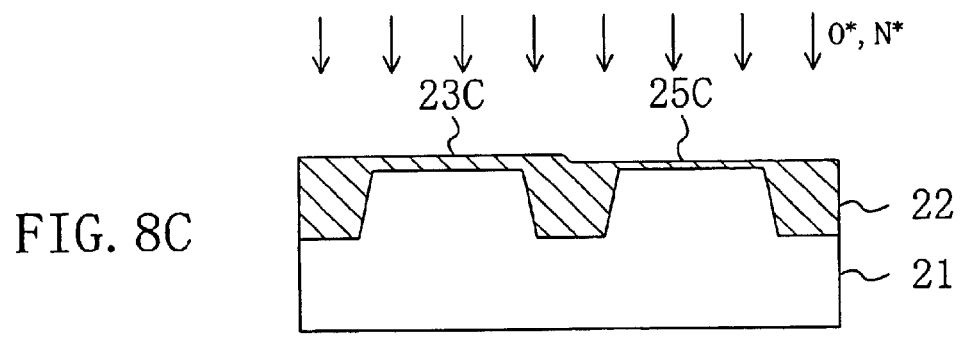

Then, as illustrated in FIG. 8C, the semiconductor substrate 21, in which the second device forming region 52 is exposed, is exposed to a nitrogen plasma and an oxygen plasma, which are produced by an inductively-coupled plasma system. Herein, the plasma gas is a mixed gas of about 95% of nitrogen and about 5% of oxygen, the frequency is about 13.56 MHz, the high-frequency power is about 500 W, the chamber pressure is about 1.33 Pa, and the substrate temperature is about 30° C. With the oxygen plasma and the nitrogen plasma, the semiconductor substrate 21 is oxidized and nitrided simultaneously, thereby forming a second gate insulating film 25C, which is a plasma oxynitride film having a thickness of about 1.6 nm, in the second device forming region 52. In this process, the first gate insulating film 23A is altered by the oxynitriding process with a nitrogen plasma and an oxygen plasma into a first gate insulating film 23C having a thickness of 7.5 nm.

Figure 8D:
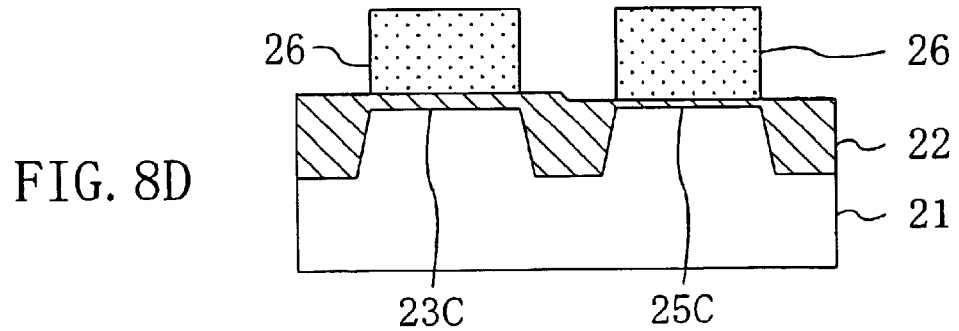

Then, a conductive film having a thickness of about 150 nm and made of polycrystal silicon having a small and randomly oriented grain structure with a grain diameter of about 20 nm is deposited by using a CVD method at a deposition temperature of 680° C. on the semiconductor substrate 21, on which the first gate insulating film 23C and the second gate insulating film 25C have been formed. Then, the deposited conductive film is subjected to a predetermined patterning process so as to form gate electrodes 26 from the conductive film, thereby obtaining a structure as illustrated in FIG. 8D.

Then, although not shown, a predetermined ion implantation process is performed for each of the first device forming region 51 and the second device forming region 52 so as to form an LDD region and a source/drain region, thereby obtaining a transistor structure.

The nitrogen concentration profiles of the first gate insulating film 23C and the second gate insulating film 25C obtained by an oxynitriding process using an inductively-coupled plasma according to the second embodiment of the present invention will now be described.

Figure 9A:
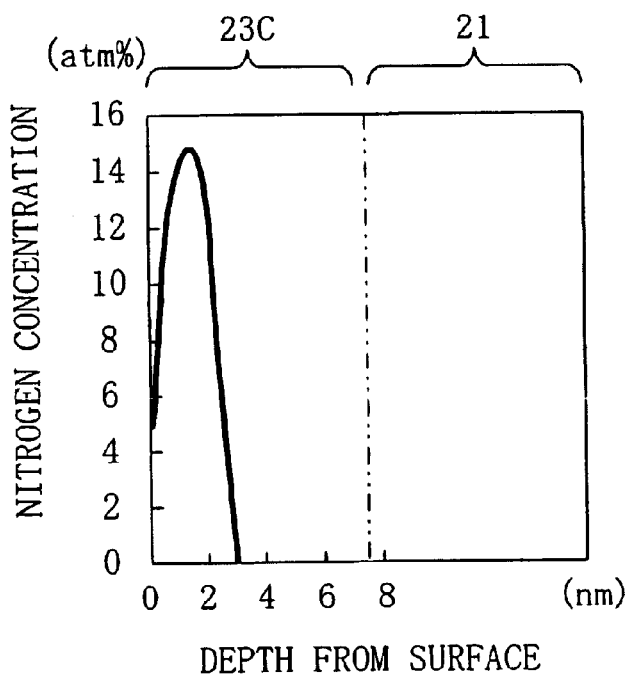
Figure 9B:
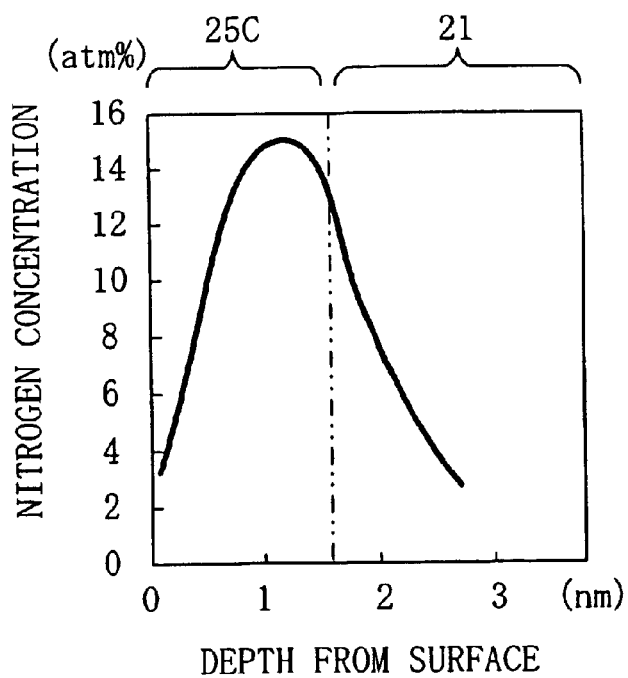

FIG. 9A and FIG. 9B are nitrogen concentration profiles in the first gate insulating film 23C and the second gate insulating film 25C, wherein FIG. 9A is for the first gate insulating film 23C and FIG. 9B is for the second gate insulating film 25C.

As illustrated in FIG. 9A, the nitrogen distribution in the first gate insulating film 23C has a concentration peak of about 15 atm % near the surface of the film. On the other hand, the nitrogen distribution of the second gate insulating film 25C illustrated in FIG. 9B has a broad distribution in the film with a concentration peak of about 15 atm % near the center of the film in the thickness direction.

The nitrogen concentrations in the first and second gate insulating films 23C and 25C can be controlled by adjusting the partial pressures of the oxygen gas and the nitrogen gas, which are plasma sources. Moreover, the nitrogen concentration can be controlled also by providing a time delay between the introduction of the oxygen gas and the introduction of the nitrogen gas. Basically, it is only necessary to simultaneously generate a nitrogen plasma and an oxygen plasma. Therefore, similar effects may be obtained using a nitrogen monoxide gas, or the like. However, since dinitrogen monoxide is strongly oxidizing, it may not be suitable for the formation of a thin film.

As described above, according to the second embodiment, despite the reduced thickness of the second gate insulating film 25C, it is possible to prevent the diffusion of dopant atoms from the gate electrode 26 into the semiconductor substrate 21 while reducing the gate leakage current. Furthermore, the dielectric constant of the second gate insulating film 25C increases, thereby increasing the resistance to dielectric breakdown.

Third Embodiment

The third embodiment of the present invention will now be described with reference to the drawings.

FIG. 10A to FIG. 10C, FIG. 11A and FIG. 11B are cross-sectional views sequentially illustrating the steps of a method for manufacturing a semiconductor device according to the third embodiment of the present invention.

Figure 10A:
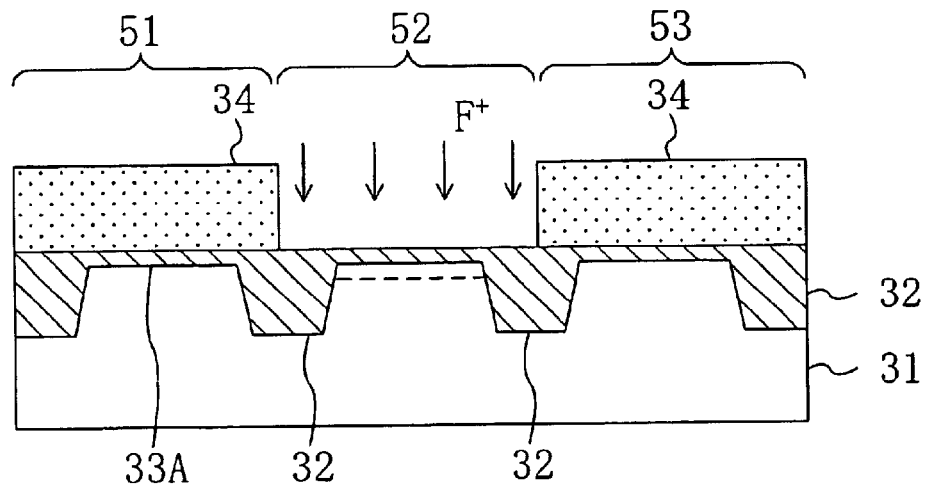
FIG. 10A to FIG. 10C are cross-sectional views sequentially illustrating steps of a method for manufacturing a semiconductor device according to the third embodiment of the present invention.

First, a device isolation region 32, which is a shallow trench isolation, is formed in an upper portion of a semiconductor substrate 31 made of P-type silicon. The device isolation region 32 partitions at least the first device forming region 51, the second device forming region 52 and a third device forming region 53 from one another. Then, although not shown, a P-type well region and an N-type well region are formed in an upper portion of the semiconductor substrate 31, and a channel doping process is performed for adjusting the threshold voltage of the transistor. Then, the surface of the semiconductor substrate 31, in which the device isolation region 32 has been formed, is subjected to an SC1 cleaning process at a temperature of about 50° C. and a cleaning process with diluted hydrofluoric acid solution (HF), so as to remove the natural oxide film from the semiconductor substrate 31. Then, the semiconductor substrate 31 is placed into an RTP, and the semiconductor substrate 31 is subjected to pyrogenic oxidization in a water vapor atmosphere at a temperature of about 1050° C., thereby forming a first gate insulating film 33A made of silicon dioxide having a thickness of about 5.5 nm on the principal surface of the semiconductor substrate 31. Then, a first resist pattern 34 having an opening in the second device forming region 52 is formed on the semiconductor substrate 31 by using a photolithography method. Then, the second device forming region 52 is implanted with, for example, fluorine ion ($F^+$) at a dose of about $5 \times 10^{14}/cm^2$ and with an acceleration energy of about 5 keV while using the first resist pattern 34 as a mask, thereby obtaining a structure as illustrated in FIG. 10A. Herein, silicon (Si) ion may be implanted instead of fluorine ion. When using silicon (Si) ion, it is necessary to optimize the implantation energy and the dose.

Figure 10B:
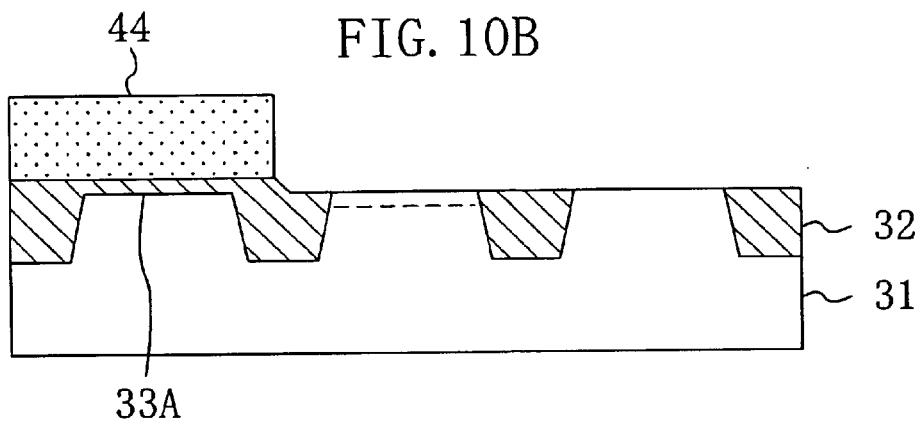

Then, as illustrated in FIG. 10B, after the first resist pattern 34 is removed, a second resist pattern 44 covering the first device forming region 51 is formed by a photolithography method. Then, a portion of the first gate insulating film 33A that is included in the second device forming region 52 and the third device forming region 53 is removed by using a diluted hydrogen fluoride solution and using the second resist pattern 44 as a mask.

Figure 10C:
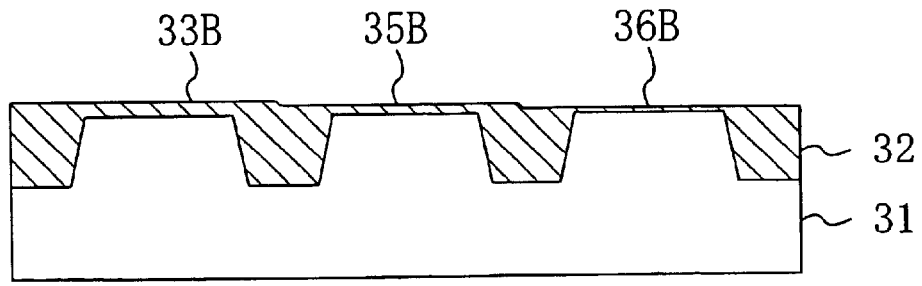

Then, as illustrated in FIG. 10C, after the second resist pattern 44 is removed by a piranha cleaning process, the second device forming region 52 of the semiconductor substrate 31 is subjected to an SC1 cleaning process at a temperature of 50° C., as a pre-cleaning process for the formation of a second gate insulating film and a third gate insulating film. Herein, the cleaning process with diluted hydrofluoric acid solution is not performed because the final process using diluted hydrofluoric acid solution would selectively etch the first gate insulating film 33A of the first device forming region 51 to significantly deteriorate the dielectric breakdown reliability thereof Then, the semiconductor substrate 31 is placed into an RTP, and the semiconductor substrate 31 is subjected to an oxynitriding process in an oxynitriding atmosphere at a temperature of about 850° C., which is made of a mixed gas of about 70% by volume of nitrogen monoxide (NO) and about 30% by volume of oxygen ($O_2$). As a result of the oxynitriding process, a second gate insulating film 35B made of silicon oxynitride having a thickness of about 2.2 nm is formed on the second device forming region 52 of the semiconductor substrate 31, while a third gate insulating film 36B made of silicon oxynitride having a thickness of about 1.8 nm is formed on the third device forming region 53.

As described above, fluorine ion having an enhanced oxidization effect is implanted at a high concentration near the surface of the second device forming region 52 of the semiconductor substrate 31, whereby the thickness of the second gate insulating film 35B formed in the second device forming region 52 is larger than the thickness of the third gate insulating film 36B formed in the third device forming region 53, into which fluorine ion is not implanted. Moreover, nitrogen atoms are introduced by this oxynitriding process also into the first gate insulating film 33A, which is thus altered into a first gate insulating film 33B made of a silicon oxynitride film. Note that there is only a slight increase in the thickness of the first gate insulating film 33B.

The nitrogen distribution of the first gate insulating film 33B is primarily the pile-up near the interface with the semiconductor substrate 31, whereas the nitrogen distribution of each of the second gate insulating film 35B and the third gate insulating film 36B has a peak near the center of the film in the thickness direction. Moreover, the peak value of the nitrogen concentration is about 6 atm % to about 8 atm %.

Figure 11A:
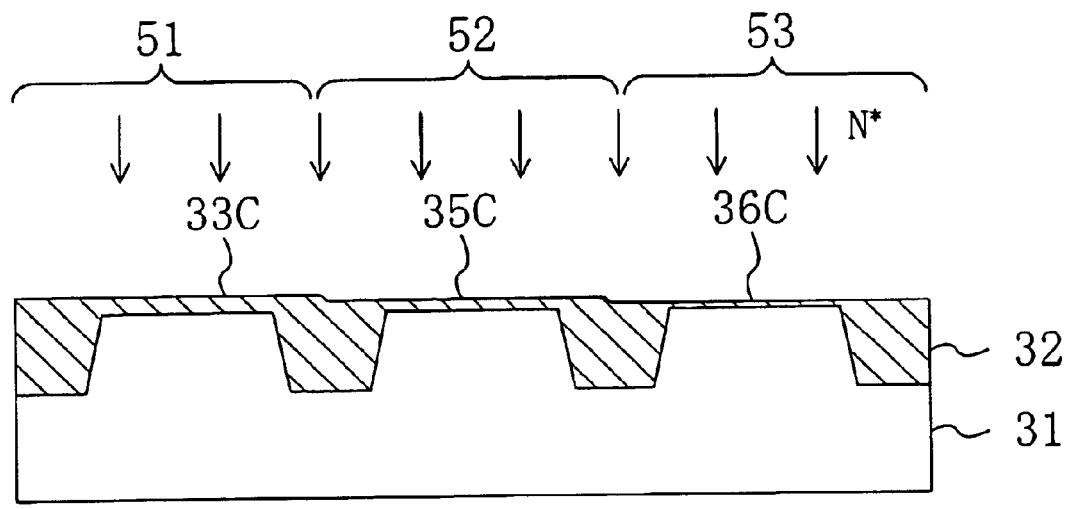
FIG. 11A and FIG. 11B are cross-sectional views sequentially illustrating steps of the method for manufacturing a semiconductor device according to the third embodiment of the present invention.

Then, as illustrated in FIG. 11A, the semiconductor substrate 31, on which the first gate insulating film 33B, the second gate insulating film 35B and the third gate insulating film 36B have been formed, is exposed to a nitrogen plasma, which is produced by an inductively-coupled plasma system, for about 120 seconds. Herein, the plasma-producing frequency is about 13.56 MHz, the high-frequency power is about 500 W, the chamber pressure is about 1.33 Pa and the substrate temperature is about 30° C. The first gate insulating film 33B is altered by the nitridation process using a nitrogen plasma into a first gate insulating film 33C made of a silicon oxynitride film having two peaks, i.e., one peak near the surface and another peak near the interface with the semiconductor substrate 31. Moreover, the second gate insulating film 35B and the third gate insulating film 36B are altered into a second gate insulating film 35C and a third gate insulating film 36C, respectively, each of which is made of a silicon oxynitride film containing a high concentration of nitrogen and has a broad concentration distribution in the insulation film with a peak value of about 15 atm %.

Figure 11B:
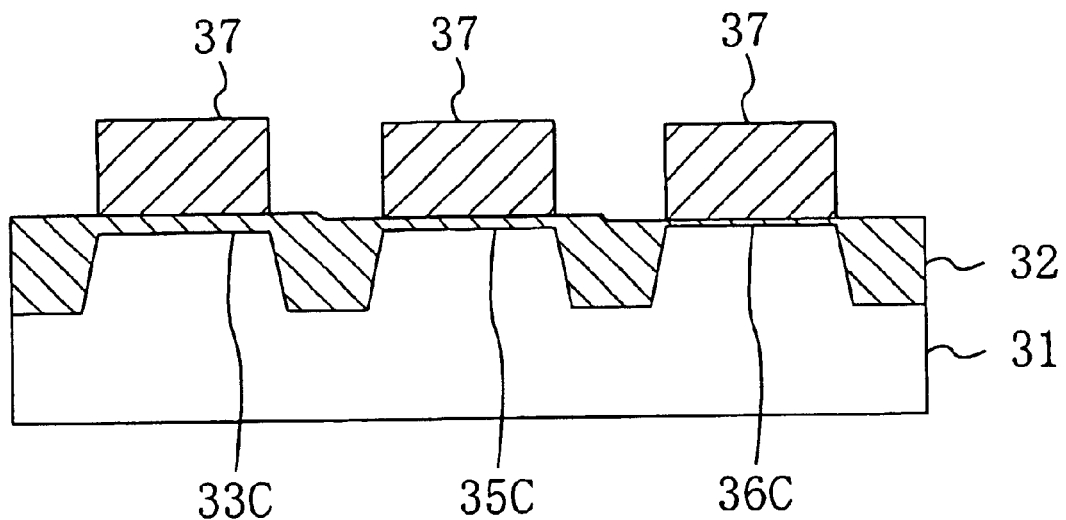
Figure 12A:
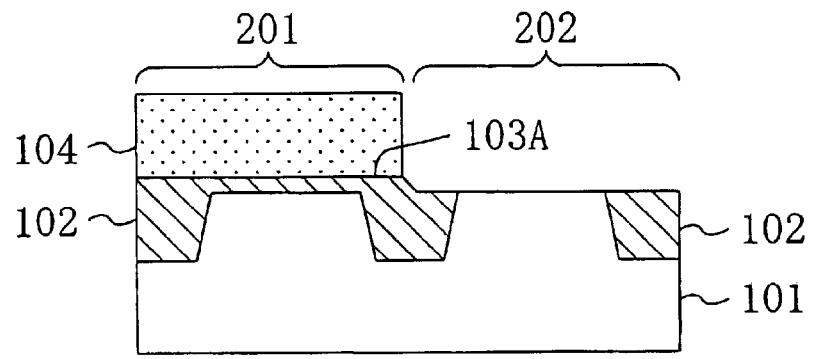
FIG. 12A to FIG. 12C are cross-sectional views sequentially illustrating the steps of a conventional method for forming a gate oxynitride film of a MOS semiconductor device.
Figure 12B:
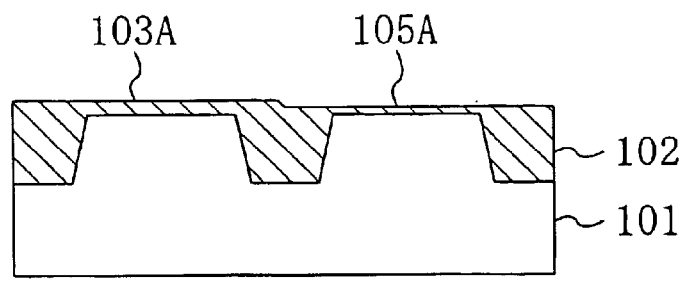
Figure 12C:
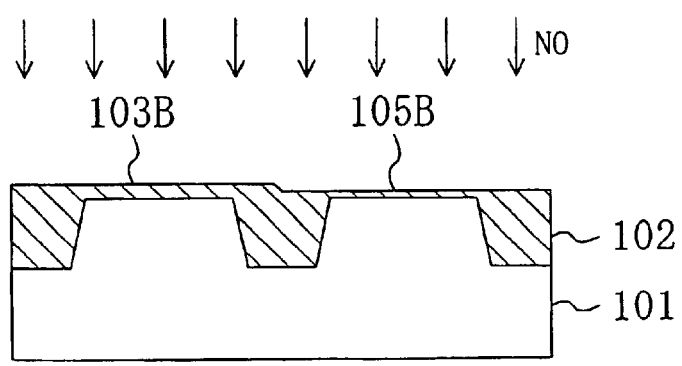
Figure 13A:
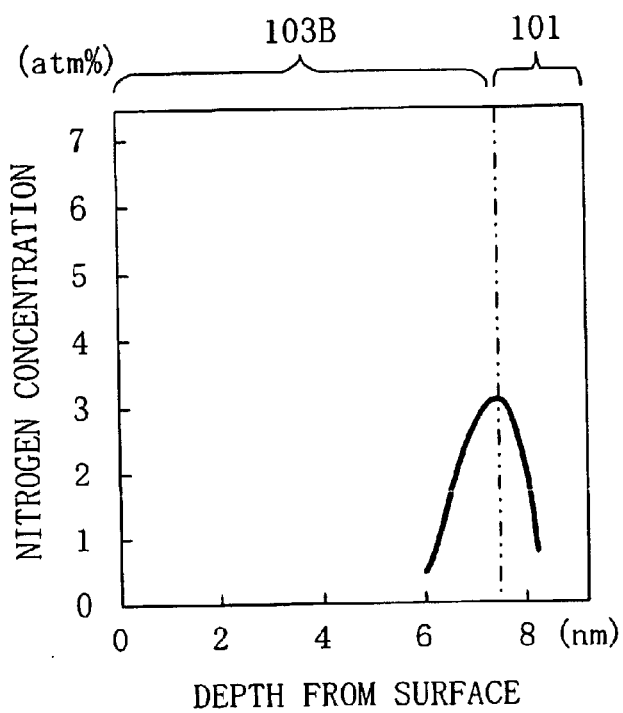
Figure 13B:
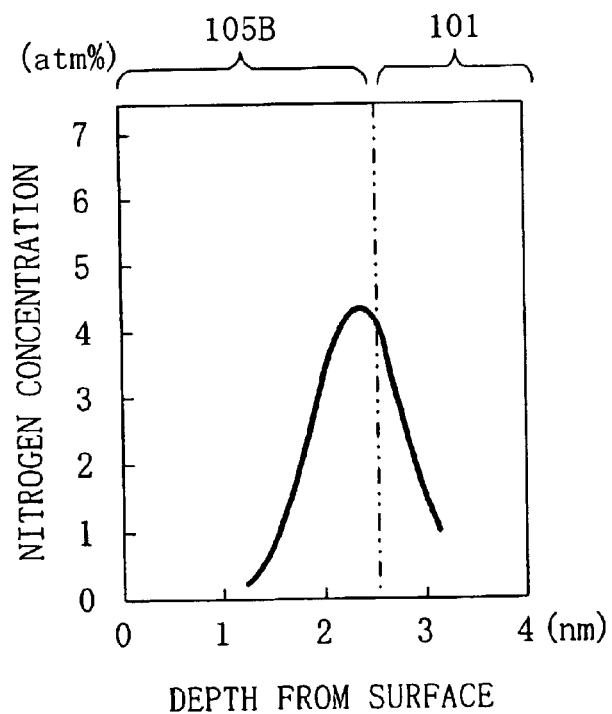

Then, a conductive film made of polycrystal silicon germanium having a thickness of about 150 nm and containing about 20 atm % of germanium (Ge) is deposited by using a CVD method at a deposition temperature of about 550° C. on the first gate insulating film 33C, the second gate insulating film 35C and the third gate insulating film 36C, which have been nitrided by a nitrogen plasma. Then, the deposited conductive film is subjected to a predetermined patterning process so as to form gate electrodes 37 from the conductive film, thereby obtaining a structure as illustrated in FIG. 11B.

Then, although not shown, a predetermined ion implantation process is performed for each of the first device forming region 51 and the second device forming region 52 so as to form an LDD region and a source/drain region, thereby obtaining a transistor structure.

As described above, according to the third embodiment, it is possible to simultaneously form, on the semiconductor substrate 31, the first gate insulating film 33C having a thickness of about 5.5 nm, the second gate insulating film 35C having a thickness of about 2.2 nm and the third gate insulating film 36C having a thickness of about 1.8 nm. In addition, the second and third gate insulating films 35C and 36C, which are made of a silicon oxynitride film having a relatively small thickness, have a broad nitrogen concentration profile with the nitrogen concentration peak being located near the center of the film in the thickness direction and the peak value being as high as about 15 atm %.

Thus, despite the reduced thicknesses of the second and third gate insulating films 35C and 36C, it is possible to prevent the diffusion of dopant atoms from the gate electrode 37 into the semiconductor substrate 31 while reducing the gate leakage current. Furthermore, the dielectric constant of each of the gate insulating films 35C and 36C increases, thereby increasing the resistance to dielectric breakdown.

Note that in the third embodiment, a plasma nitridation process is performed in the step shown in FIG. 11A. Therefore, an oxidization process may be used instead of an oxynitriding process for forming the second gate insulating film 35B and the third gate insulating film 36B, which are formed in the step shown in FIG. 10C. However, when the gate insulating films 35C and 36C are made of an silicon oxide film obtained by an oxidization process, the integrated value of the nitrogen concentration of each of the insulation films 35C and 36C is smaller than that in a case where it is made of silicon oxynitride. Thus, the nitrogen concentrations of the second and third gate insulating films 35C and 36C may be adjusted by selecting a nitridation method in view of the degree of reduction in the gate leakage current, the degree of suppression of the boron penetration.

Moreover, also in a case where silicon oxynitride is selected as the composition of the second and third gate insulating films 35B and 36B, the oxynitriding atmosphere is not limited to a mixed atmosphere of nitrogen monoxide and oxygen, but may alternatively be a mixed atmosphere of nitrogen monoxide and dinitrogen monoxide or an atmosphere solely of dinitrogen monoxide. Any suitable film formation method may be selected according to the nitrogen concentrations of the second and third gate insulating films 35C and 36C.

Furthermore, in the plasma nitridation step shown in FIG. 10C, the plasma source is not limited to a nitrogen gas. For example, an oxynitriding process with a nitrogen plasma and an oxygen plasma obtained by using a nitrogen monoxide gas may alternatively be employed. In other words, the plasma source is not limited to any particular plasma source as long as a nitrogen plasma containing no hydrogen can be produced.

Moreover, while the third embodiment is directed to a method for forming a gate insulating film having three portions of different thicknesses in a MOS semiconductor device, a gate insulating film having four or more portions of different thicknesses can be formed by forming device forming regions into which fluorine ion is implanted with different doses, and then performing the oxynitriding process and the plasma nitridation process as described above.

What is claimed is:

1. A method for manufacturing a semiconductor device, comprising the steps of:
   (a) partitioning a semiconductor substrate into a first region and a second region;
   (b) forming a first base gate insulating film made of a thermal oxide film on the first region and the second region;
   (c) after the step (b), removing the first base gate insulating film in the second region;
   (d) after the step (c), forming a second base gate insulating film having a thickness smaller than that of the first base gate insulating film on the second region of the semiconductor substrate; and
   (e) after the step (d), exposing the first base gate insulating film and the second base gate insulating film to a nitrogen plasma so as to introduce nitrogen into the first base gate insulating film and the second base gate insulating film, thereby forming a first gate insulating film from the first base gate insulating film and a second gate insulating film from the second base gate insulating film, wherein nitrogen from the nitrogen plasma in the step (e) is only introduced to the surface portion of the first gate insulating film such that the nitrogen does not reach the interface between the first gate insulating film and the semiconductor substrate, and the nitrogen is introduced to the second gate insulating film, such that the nitrogen reaches the interface between the second gate insulating film and the semiconductor substrate.

2. The method for manufacturing a semiconductor device of claim 1, wherein in the step (d), the semiconductor substrate is subjected to a heat treatment in an oxidizing atmosphere so as to form the second base gate insulating film made of an oxide film on the semiconductor substrate.

3. The method for manufacturing a semiconductor device of claim 1, further comprising, after the step (b) and before the step (d), a step of implanting impurity ion that causes an enhanced oxidization effect into the semiconductor substrate.

4. The method for manufacturing a semiconductor device of claim 3, wherein the impurity ion is fluorine or silicon, which is implanted into a portion of the semiconductor substrate near a surface thereof at a dose equal to or greater than $1 \times 10^{14}$ cm$^{-2}$ and less than or equal to $5 \times 10^{15}$ cm$^{-2}$.

5. The method for manufacturing a semiconductor device of claim 1, wherein in the step (d), the semiconductor substrate is subjected to a heat treatment in an oxynitriding atmosphere containing no hydrogen so as to form the second base gate insulating film made of an oxynitride film on the semiconductor substrate.

6. The method for manufacturing a semiconductor device of claim 5, wherein the oxynitriding atmosphere is an atmosphere containing nitrogen monoxide and oxygen or an atmosphere containing dinitrogen monoxide.

7. The method for manufacturing a semiconductor device of claim 5, wherein in the step (d), a heat treatment is performed on the semiconductor substrate in the oxynitriding atmosphere, thereby introducing nitrogen into the first base gate insulating film and reforming the first base gate insulating film into an oxynitride film.

8. The method for manufacturing a semiconductor device of claim 1, wherein in the step (d), the semiconductor substrate is subjected to an oxynitriding atmosphere containing a nitrogen plasma and an oxygen plasma produced from dinitrogen monoxide so as to form the second base gate insulating film made of an oxynitride film on the semiconductor substrate.

9. The method for manufacturing a semiconductor device of claim 8, wherein in the step (d), a heat treatment is performed on the semiconductor substrate in the oxynitriding atmosphere, thereby introducing nitrogen into the first base gate insulating film and reforming the first base gate insulating film into an oxynitride film.

10. The method for manufacturing a semiconductor device of claim 1, wherein:
a thickness of the first gate insulating film is equal to or greater than 3.5 nm and less than or equal to 9 nm, and a thickness of the second gate insulating film is equal to or greater than 1.0 nm and less than or equal to 3.0 nm.

11. The method for manufacturing a semiconductor device of claim 1, wherein:
a nitrogen concentration distribution of the first gate insulating film has a peak near a surface of the first gate insulating film; and
a nitrogen concentration distribution of the second gate insulating film has a peak near a center of the second gate insulating film in a thickness direction.

12. The method for manufacturing a semiconductor device of claim 1, wherein the nitrogen plasma is a high-density plasma at a temperature in a range from room temperature to 500° C.

13. The method for manufacturing a semiconductor device of claim 1, wherein a peak value of nitrogen concentration in the first and second gate insulating films is equal to or greater than 10 atm % and less than or equal to 40 atm %.

14. The method for manufacturing a semiconductor device of claim 1, wherein the nitrogen concentration in the interface between the second gate insulating film and the semiconductor substrate is between 0.2 atm % and 3 atm %.

15. The method for manufacturing a semiconductor device of claim 14, wherein the nitrogen concentration in the interface between the second gate insulating film and the semiconductor substrate is between 0.5 atm % and 1 atm %.

16. The method for manufacturing a semiconductor device of claim 1, wherein in the step (e), an oxygen plasma is added to the nitrogen plasma.

17. A method for manufacturing a semiconductor device, comprising the steps of:
(a) partitioning the semiconductor substrate into a first region, a second region and a third region;
(b) forming a first base gate insulating film made of a thermal oxide film on the first region, the second region and the third region;
(c) after the step (b), implanting impurity ion that causes an enhanced oxidization effect into the second region of the semiconductor substrate;
(d) after the step (c), removing the first base gate insulating film in the second and third regions;
(e) after the step (d), forming a second base gate insulating film having a thickness smaller than that of the first base gate insulating film on the second region of the semiconductor substrate, and a third base gate insulating film to be the gate insulating film having a thickness smaller than that of the second base gate insulating film on the third region; and (f) after the step (e), exposing the first base gate insulating film, the second base gate insulating film and the third base gate insulating film to a nitrogen plasma so as to introduce nitrogen atoms into the first base gate insulating film, the second base gate insulating film and the third base gate insulating film, thereby forming a first gate insulating film from the first base gate insulating film, a second gate insulating film from the second base gate insulating film and a third gate insulating film to be the gate insulating film from the third base gate insulating film, wherein nitrogen from the nitrogen plasma in the step (f) is only introduced to the surface portion of the first gate insulating film such that the nitrogen does not reach the interface between the first gate insulating film and the semiconductor substrate, and the nitrogen is introduced to the third gate insulating film, such that the nitrogen reaches the interface between the third gate insulating film and the semiconductor substrate.

18. The method for manufacturing a semiconductor device of claim 17, wherein the impurity ion is fluorine or silicon, which is implanted into a portion of the semiconductor substrate near a surface thereof at a dose equal to or greater than $1 \times 10^{14}$ cm$^{-2}$ and less than or equal to $5 \times 10^{15}$ cm$^{-2}$.

19. A method for manufacturing a semiconductor device, comprising the steps of:
(a) partitioning the semiconductor substrate into a first region and a second region;
(b) forming a first base gate insulating film made of a thermal oxide film on the first region and the second region;
(c) after the step (b), removing the first base gate insulating film in the second region; and
(d) after the step (c), exposing the entire surface of the semiconductor substrate including the first base gate insulating film to the nitrogen plasma and the oxygen plasma so as to form a second gate insulating film to be the gate insulating film having a thickness thinner than that of the first base gate insulating film on the second region and to introduce nitrogen into the first base gate insulating film, thereby forming a first gate insulating film from the first base gate insulating film, wherein nitrogen from the nitrogen plasma in the step (d) is only introduced to the surface portion of the first gate insulating film such that the nitrogen does not reach the interface between the first gate insulating film and the semiconductor substrate, and the nitrogen is introduced to the second gate insulating film, such that the nitrogen reaches the interface between the second gate insulating film and the semiconductor substrate.

20. The method for manufacturing a semiconductor device of claim 19, wherein:
a thickness of the first gate insulating film is equal to or greater than 3.5 nm and less than or equal to 9 nm, and a nitrogen concentration distribution thereof has a peak near a surface of the first gate insulating film; and
a thickness of the second gate insulating film is equal to or greater than 1.0 nm and less than or equal to 3.0 nm, and a nitrogen concentration distribution thereof has a peak near a center of the second gate insulating film in a thickness direction.

* * * * *